US011968778B2

(12) United States Patent
Lee et al.

(10) Patent No.: US 11,968,778 B2
(45) Date of Patent: Apr. 23, 2024

(54) STRETCHABLE SUBSTRATE HAVING IMPROVED STRETCH UNIFORMITY AND METHOD OF MANUFACTURING THE SAME

(71) Applicant: Korea Institute of Science and Technology, Seoul (KR)

(72) Inventors: Phillip Lee, Seoul (KR); SeungJun Chung, Seoul (KR); HeeSuk Kim, Seoul (KR); JeongGon Son, Seoul (KR); SukJoon Hwang, Seoul (KR)

(73) Assignee: Korea Institute of Science and Technology, Seoul (KR)

(*) Notice: Subject to any disclaimer, the term of this patent is extended or adjusted under 35 U.S.C. 154(b) by 0 days.

(21) Appl. No.: 17/703,520

(22) Filed: Mar. 24, 2022

(65) Prior Publication Data

US 2023/0217588 A1    Jul. 6, 2023

(30) Foreign Application Priority Data

Dec. 31, 2021 (KR) .......................... 10-2021-0193784

(51) Int. Cl.
*H05K 1/02* (2006.01)
*A41D 1/00* (2018.01)
(Continued)

(52) U.S. Cl.
CPC ............. *H05K 1/0283* (2013.01); *H05K 3/00* (2013.01); *H05K 2201/09063* (2013.01)

(58) Field of Classification Search
CPC .......... H05K 1/02; H05K 1/0283; H05K 1/03; H05K 1/036; H05K 3/00; H05K 3/0011; H05K 3/4697; H05K 2201/0116; H05K 2201/0133; H05K 2201/09063; A41D 1/00; A41D 1/06; A41D 13/00; A41D 13/05; A42B 1/08; A42B 1/22; A42B 1/041; A43B 23/028; A43B 23/042; A43B 23/0215;
(Continued)

(56) References Cited

U.S. PATENT DOCUMENTS 7,678,440 B1* 3/2010 McKnight ................. B32B 3/26
    148/563
10,195,815 B2* 2/2019 Toronjo ..................... A42B 1/041
(Continued)

FOREIGN PATENT DOCUMENTS

KR    10-2018-0061003 A    6/2018
KR    10-2021-0073647 A    6/2021
(Continued)

OTHER PUBLICATIONS

A Notice of Allowance mailed by the Korean Intellectual Property Office on Aug. 22, 2022, which corresponds to Korean Patent Application No. 10-2021-0193784 and is related to U.S. Appl. No. 17/703,520.

*Primary Examiner* — Xiaoliang Chen
(74) *Attorney, Agent, or Firm* — Studebaker & Brackett PC

(57) ABSTRACT

Disclosed is a method of manufacturing a stretchable substrate having improved stretch uniformity according to various embodiments of the present disclosure in order to implement the above-described object. The method may include forming an auxetic including a plurality of unit structures, and attaching one or more elastic sheets to the auxetic and forming a stretchable substrate.

7 Claims, 11 Drawing Sheets

(51) Int. Cl.
*A41D 1/06* (2006.01)
*A41D 13/00* (2006.01)
*A41D 13/05* (2006.01)
*A42B 1/041* (2021.01)
*A42B 1/08* (2006.01)
*A42B 1/22* (2006.01)
*A43B 23/28* (2006.01)
*B32B 38/08* (2006.01)
*H05K 1/03* (2006.01)
*H05K 3/00* (2006.01)

(58) Field of Classification Search
CPC ... B32B 38/08; B32B 38/145; B32B 2437/00; B32B 2071/1208; B32B 2071/1258; B32B 2307/51; B32B 2571/00
USPC .................................. 174/254; 2/69; 36/45
See application file for complete search history.

(56) References Cited

U.S. PATENT DOCUMENTS

| | | | | |
|---|---|---|---|---|
| 10,549,505 | B2* | 2/2020 | Tibbits | B32B 3/266 |
| 2006/0163431 | A1* | 7/2006 | Dittrich | B64C 3/26 244/126 |
| 2008/0248710 | A1* | 10/2008 | Wittner | D04H 3/16 156/60 |
| 2010/0330330 | A1* | 12/2010 | Luca | B29C 44/5654 428/137 |
| 2012/0241312 | A1* | 9/2012 | Keefe | B29C 59/02 204/242 |
| 2014/0059734 | A1* | 3/2014 | Toronjo | A43B 3/26 2/69 |
| 2014/0101816 | A1* | 4/2014 | Toronjo | A42B 1/041 36/83 |
| 2014/0109286 | A1* | 4/2014 | Blakely | A43B 23/0215 2/69 |
| 2014/0276995 | A1* | 9/2014 | Lau | A61F 2/0063 606/151 |
| 2015/0073324 | A1* | 3/2015 | Liebe | A61F 13/00034 428/101 |
| 2015/0073369 | A1* | 3/2015 | Hippe | A61F 13/00034 604/385.01 |
| 2015/0073372 | A1* | 3/2015 | Hippe | B32B 7/05 604/385.16 |
| 2016/0067939 | A1* | 3/2016 | Liebe | A61F 13/49011 428/101 |
| 2017/0099900 | A1* | 4/2017 | Toronjo | A43B 23/027 |
| 2017/0156443 | A1* | 6/2017 | Guyan | A43B 23/027 |
| 2017/0182732 | A1* | 6/2017 | Toronjo | A45F 3/12 |
| 2018/0199651 | A1* | 7/2018 | Blakely | A41D 31/04 |
| 2018/0325216 | A1* | 11/2018 | Toronjo | A43B 23/0265 |
| 2019/0380439 | A1* | 12/2019 | Toronjo | A45F 3/12 |
| 2020/0187858 | A1* | 6/2020 | Han | A61B 5/442 |
| 2020/0361590 | A1* | 11/2020 | Melo | B64B 1/58 |
| 2021/0227935 | A1* | 7/2021 | Webster | B32B 27/302 |
| 2021/0386151 | A1* | 12/2021 | Blakely | A42B 1/22 |
| 2021/0399203 | A1* | 12/2021 | Farhangdoust | H10N 30/302 |
| 2021/0399658 | A1* | 12/2021 | Farhangdoust | G01M 5/0066 |
| 2021/0401118 | A1* | 12/2021 | Toronjo | A43B 23/026 |
| 2021/0401119 | A1* | 12/2021 | Toronjo | A43B 23/026 |
| 2022/0053882 | A1* | 2/2022 | Toronjo | A43B 23/027 |
| 2022/0161462 | A1* | 5/2022 | Chung | B32B 7/022 |
| 2022/0161517 | A1* | 5/2022 | Lee | B32B 7/022 |
| 2022/0162060 | A1* | 5/2022 | Chung | H05K 1/0283 |

FOREIGN PATENT DOCUMENTS

| | | |
|---|---|---|
| KR | 10-2279065 B1 | 7/2021 |
| KR | 10-2279068 B1 | 7/2021 |

* cited by examiner

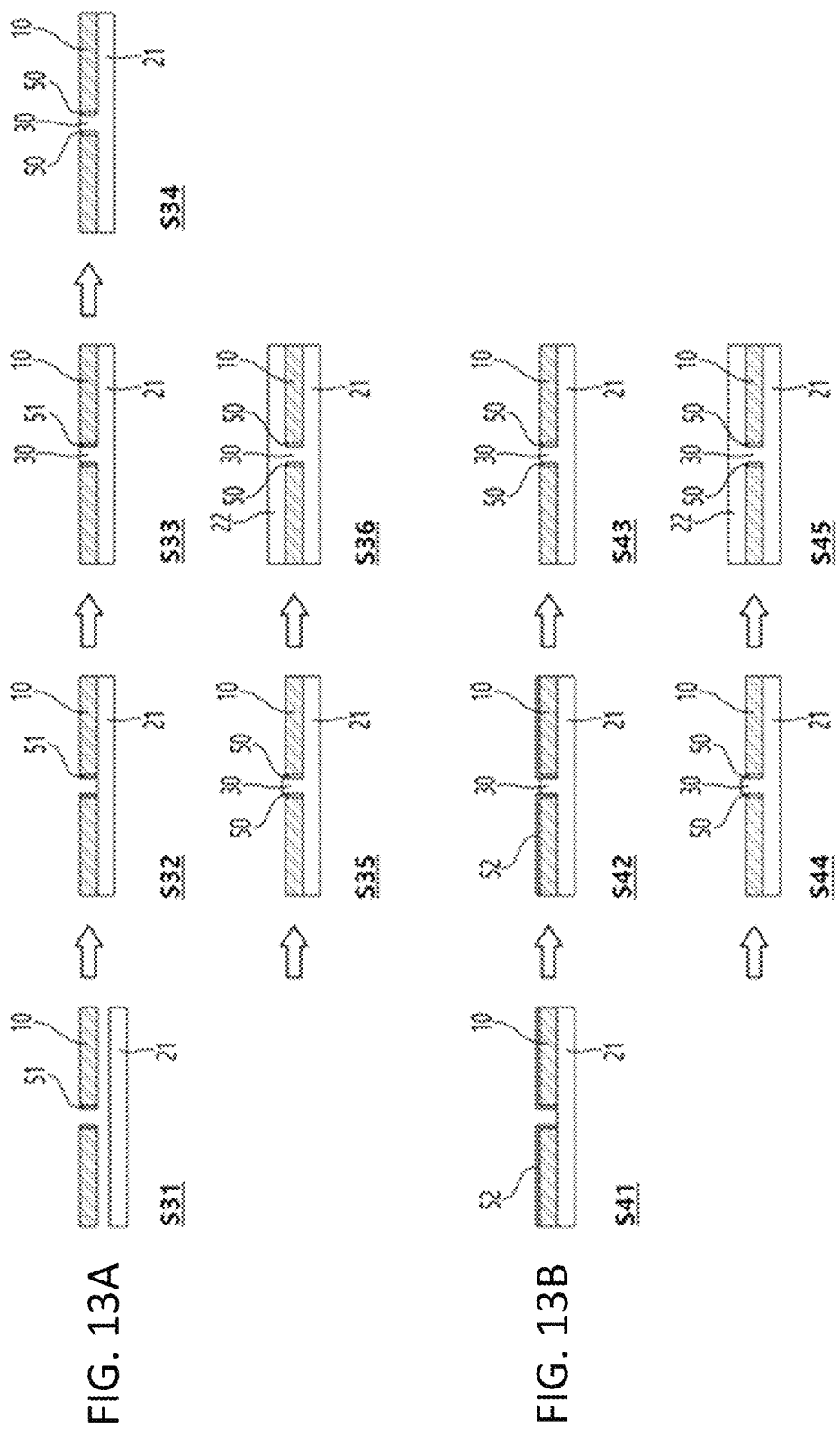

STRETCHABLE SUBSTRATE HAVING IMPROVED STRETCH UNIFORMITY AND METHOD OF MANUFACTURING THE SAME

CROSS-REFERENCE TO RELATED APPLICATION

This application claims priority to and the benefit of Korean Patent Application No. 10-2021-0193784, filed on Dec. 31, 2021, the disclosure of which is incorporated herein by reference in its entirety.

BACKGROUND

1. Field of the Invention

The present disclosure relates to a stretchable substrate, and more specifically, to a stretchable substrate in which, when an elastic substrate is provided to include a mechanical metamaterial with a negative Poisson's ratio, a strain for each section of an entire surface of the corresponding elastic substrate is uniformly controllable, and a method of manufacturing the same.

2. Discussion of Related Art

In recent years, in addition to conductive elements in which electrodes are formed on a rigid substrate, research and development has been actively conducted on stretchable electronic elements in which electrodes are formed on a flexible substrate. Stretchable electronic elements are electronic elements that are manufactured on a substrate stretchable freely in response to external stress and are next-generation electronic elements that maintain the electrical/physical properties of an element even when mechanical deformation occurs or external force is applied. Such stretchable electronic elements may be applied to flexible devices, wearable devices, or the like and, furthermore, may be used as displays, sensors or electrodes attached to the human body or the like.

Stretchable electronic elements may be most widely used in fields such as stretchable displays, stretchable solar cells, and stretchable energy storage/power generation devices. The stretchable electronic elements are showing potential as a next-generation technology that follows flexible displays. In addition, the stretchable electronic elements not only increase a degree of freedom in design due to excellent mechanical variability thereof but also secure mechanical stability against an external force, thereby expanding to markets such as wearable devices, electronic skin, smartphones, medical devices, healthcare monitoring systems, defense industries, and aerospace industries.

For a specific example, a display field is developed in a direction in which a degree of freedom of deformation is increased from a fixed flat/curved display to a flexible, foldable, or rollable display that is foldable or rollable in a single direction. Recently, as electronic devices have become smart and spatial mobility thereof is emphasized, there is a need to develop a stretchable display that is deformable in a multidimensional axis direction under various conditions and freely usable in addition to a fixed display.

As described above, it is expected that, with the advancement of technology related to a stretchable display field, the implementation of a new digital interface that goes beyond the existing method will be possible. For example, a stretchable substrate may be implemented using an elastic substrate, of which, when stretched in one axial direction, a strain in another axial direction is controllable, that is, an elastic substrate having a negative Poisson's ratio.

However, in such a stretchable display, a negative Poisson's ratio is controllable in terms of the entirety of the substrate, but stress may be non-uniform for each pixel section. Specifically, in the case of a stretchable substrate using an auxetic structure, when the stretchable substrate is stretched, a strain may be controlled in an in-plane direction perpendicular to a stretching direction, but respective pixel sections may have different elongations.

When respective pixel sections of a stretchable display have different tensile elongations in response to stretching in one direction, a distortion of pixels in the in-plane direction may be maximized. In addition, a warpage may be caused for each section of a stretchable element, mechanical separation of elements positioned on a stretchable substrate may be accelerated, thereby reducing a lifetime of the element.

Accordingly, in the art, there may be a demand for a stretchable substrate in which a stretchable substrate having a negative Poisson's ratio is provided to control a strain in an in-plane direction perpendicular to a stretching direction and concurrently to minimize a distortion and a warpage by uniformizing a tensile elongation distribution in the substrate.

SUMMARY OF THE INVENTION

The present disclosure is directed to providing a stretchable substrate in which a stretchable substrate having a negative Poisson's ratio is provided to control a strain in an in-plane direction perpendicular to a stretching direction and concurrently to minimize a distortion and a warpage by uniformizing a tensile elongation distribution in the substrate.

The technical objects of the present disclosure are not limited to the above-described ones, and the other undescribed technical objects will become apparent to those skilled in the art from the following description.

According to an aspect of the present disclosure, there is provided a method of manufacturing a stretchable substrate having improved stretch uniformity including forming an auxetic including a plurality of unit structures, and attaching one or more elastic sheets to the auxetic and forming a stretchable substrate.

In response to an external force generated in one axial direction, each of the plurality of unit structures may cause deformation of the auxetic in another axial direction.

The forming of the auxetic may include performing a printing process using an elastic material.

The forming of the auxetic may include forming the auxetic which includes the plurality of unit structures having a shape corresponding to a chiral structure.

The forming of the stretchable substrate may include filling a plurality of central holes related to central portions of the plurality of unit structures with elastic bodies, and attaching the one or more elastic sheets to the elastic body corresponding to each of the central holes to form the stretchable substrate.

The elastic body may include an elastic material having an elastic force and may be made of the same material as the elastic sheet.

The one or more elastic sheets may include a first elastic sheet attached to a first surface of the auxetic and a second elastic sheet attached to a second surface opposite to the first surface, the forming of the stretchable substrate may include applying a lubricant on an inner peripheral surface of the central hole, bringing the first elastic sheet into contact with the first surface, filling each of the plurality of central holes with the elastic body in a downward direction of the second surface and curing each of the elastic bodies and the first elastic sheet, and bringing the second elastic sheet into contact with the second surface and curing each of the elastic bodies and the second elastic sheet, and the lubricant may be provided between the unit structure and the elastic body.

The one or more elastic sheets may include a first elastic sheet attached to a first surface of the auxetic and a second elastic sheet attached to a second surface opposite to the first surface, the forming of the stretchable substrate may include forming a protective frame on an inner peripheral surface of the central hole, bringing the first elastic sheet into contact with the first surface, filling each of the plurality of central holes with the elastic body in a downward direction of the second surface and curing each of the elastic bodies and the first elastic sheet, removing the protective frame, and bringing the second elastic sheet into contact with the second surface and curing the elastic body and the second elastic sheet, and an air gap based on the protective frame may be formed between the unit structure and the elastic body.

The protective frame may be made using a solute dissolved in a solvent, and the removing of the protective frame may include supplying the solvent to remove the protective frame.

The air gap may allow the elastic body and the auxetic to be deformed independently from each other in response to stretching in various axial directions.

According to another aspect of the present disclosure, there is provided a stretchable substrate having improved stretch uniformity including an auxetic which includes a plurality of unit structures and has a negative Poisson's ratio, and one or more elastic sheets attached to both surfaces of the auxetic.

The auxetic may include a plurality of central holes formed in central portions of the plurality of unit structures, and a plurality of elastic bodies with which the central holes are filled.

The plurality of elastic bodies may include an elastic material having an elastic force and may be made of the same material as the elastic sheet.

The stretchable substrate may further include a lubricant provided between each elastic body and each central hole corresponding to one of the plurality of unit structures.

The stretchable substrate may further include an air gap formed between the elastic body and each of the central holes corresponding to one of the plurality of unit structures.

The stretchable substrate may further include a protective frame configured to temporarily support the elastic body in a process of forming the air gap, and the protective frame may be made using a solute dissolved in a solvent.

According to still another aspect of the present disclosure, there is provided a method of manufacturing a flexible electronic device including forming a stretchable substrate in which an auxetic including a plurality of unit structures is formed, and positioning a flexible electrode on the stretchable substrate, wherein the forming of the stretchable substrate includes forming the auxetic which includes the plurality of unit structures having a shape corresponding to a chiral structure, and attaching one or more elastic sheets to the auxetic to form the stretchable substrate.

According to yet another aspect of the present disclosure, there is provided a flexible electronic device including a stretchable substrate, and a flexible electrode formed on the stretchable substrate, wherein the stretchable substrate includes an auxetic including a plurality of unit structures and having a negative Poisson's ratio, and one or more elastic sheets attached to both surfaces of the auxetic, and the auxetic includes a plurality of central holes formed in central portions of the plurality of unit structures, and a plurality of elastic bodies with which the central holes are filled.

Other concrete matters of the present disclosure are included in the detailed description and accompanying drawings of the specification.

BRIEF DESCRIPTION OF THE DRAWINGS

Now, various aspects will be described with reference to the accompanying drawings and like reference numerals collectively designate like elements. In the following embodiments, for the purpose of description, various specific details are suggested to provide overall understanding of one or more aspects. However, it is obvious that the aspects may be embodied without the specific details.

FIGS. 13A and 13B show exemplary diagrams illustrating processes of manufacturing a stretchable substrate based on an auxetic having a chiral structure according to another embodiment of the present disclosure.

DETAILED DESCRIPTION OF EXEMPLARY EMBODIMENTS

Figure 1:
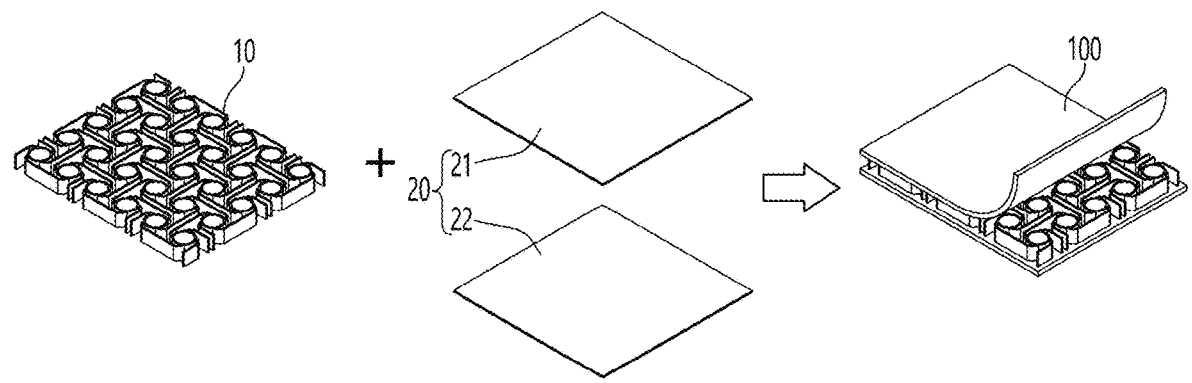
FIG. 1 shows a schematic diagram illustrating a stretchable substrate having improved stretch uniformity according to one embodiment of the present disclosure.

Various embodiments and/or aspects will be disclosed with reference to the accompanying drawings. In the following description, for the purpose of description, various specific details are disclosed to provide overall understanding of one or more aspects. However, those skilled in the art may understand that the aspect(s) may be embodied without having the specific details. The following description and accompanying drawings thoroughly describe specific exemplary aspects of one or more aspects. However, the aspects are provided for an illustrative purpose, some of various methods in principles of the various aspects may be used, and the descriptions are intended to include all of the aspects and equivalents thereof. Specifically, the "embodiment," "example," "aspect," "illustration," and the like used in the present specification may not be interpreted as a described arbitrary aspect or design being better than or more advantageous than other aspects or designs.

Hereinafter, in the drawings, the same or similar elements are denoted by the same reference numerals even though they are depicted in different drawings, and a detailed description of the same or similar elements will be omitted. In addition, in the following description of the embodiments disclosed herein, a detailed description of related arts will be omitted when it is determined that the gist of the embodiments disclosed herein may be obscured. Also, the accompanying drawings are used to help easily understand the embodiments disclosed herein, and it should be understood that the technical idea disclosed herein are not limited by the accompanying drawings.

It will be understood that, although the terms first, second, etc. may be used herein to describe various elements or components, these elements or components should not be limited by these terms. These terms are only used to distinguish one element or component from another element or component. Thus, a first element or component discussed below could be termed a second element or component without departing from the technical idea of the present disclosure.

Unless otherwise defined, all terms (including technical and scientific terms) used in the present specification may be used as the same meaning which may be commonly understood by the person with ordinary skill in the art to which the present disclosure belongs. It will be further understood that terms defined in commonly used dictionaries should not be interpreted in an idealized or excessive sense unless expressly and specifically defined.

Further, the term "or" is intended to mean not exclusive "or" but implicational "or." That is, when it is not specifically designated or unclear in the context, "X uses A or B" is intended to refer to one of natural implicational substitutions. In other words, "X uses A or B" may be applied to any case of "X uses A," "X uses B," or "X uses both A and B." Further, it should be understood that the term "and/or" used in the present specification indicates and includes all possible combinations of one or more items among related listed items.

It should be understood that the term "comprise" and/or "comprising" means existence of the corresponding feature and/or element but does not exclude the existence or addition of one or more other features, elements, and a group thereof. In addition, when not separately defined or not clear in terms of the context that a singular form is indicated, it should be construed that the singular form generally means "one or more" in the present specification and the claims.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

In addition, a term "module," "unit," or "portion" of an element used herein is assigned or incorporated for convenience of specification description, and the suffix itself does not have a distinguished meaning or function.

It will be understood that when an element or layer is referred to as being "on" or "above" another element or layer, the element or layer can be directly on or above another element or layer or intervening elements or layers may be present. In contrast, when an element is referred to as being "directly on" or "directly above," there are no intervening elements or layers.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or in operation, in addition to the orientation depicted in the figures.

For example, when the device in the figures is turned over, elements described as "below" or "beneath" or "under" other elements or features would then be oriented "above" the other elements or features. Thus, the exemplary term "below" can encompass both an orientation of above and below. Since an element may be oriented in another direction, the spatially-relative terms may be interpreted in accordance with the orientation of the element.

The objects and effects of the present disclosure and technical solutions for accomplishing these may be apparent with reference to embodiments to be described below in detail along with the accompanying drawings. In the description of the present disclosure, when it is determined that detailed descriptions of known functions or configurations unnecessarily obscure the subject matter of the present disclosure, the detailed descriptions will be omitted. The terms as set forth herein are defined in consideration of the functions of the present disclosure and may vary according to customs or the intent of a user and an operator.

However, the present disclosure is not limited to the embodiments set forth below and may be embodied in various other forms. The present embodiments may be provided to make the present disclosure complete and to enable the person skilled in the art to fully understand the category of the present disclosure. The present disclosure may be defined only by the category described in the appended claims. Thus, the definition may be made based on the entirety of the description of the present specification.

FIG. 1 shows a schematic diagram illustrating a stretchable substrate 100 having improved stretch uniformity according to one embodiment of the present disclosure. The stretchable substrate 100 may include an auxetic 10 which has a negative Poisson's ratio and is formed through a plurality of unit structures. The auxetic 10 may refer to a mechanical metamaterial having a mechanism for exhibiting a new mechanical function, which did not previously exist, through a plurality of unit structures. For example, the auxetic 10 related to the mechanical metamaterial may have a structure that expands in a direction perpendicular to a typical stretching direction in nature.

Specifically, the auxetic 10 included in the stretchable substrate 100 may include the plurality of unit structures. In this case, since each unit structure is provided with one or more shapes, the auxetic 10 may have a negative Poisson's ratio. A Poisson's ratio may refer to a ratio of transverse strain to longitudinal strain when a tensile force is applied to a material to stretch the material in a specific direction. In other words, the Poisson's ratio may refer to a strain between a transverse direction and a longitudinal direction.

Most materials have a positive Poisson's ratio because a strain in a stretching direction and a strain in a lateral direction of a material have different signs when a tensile force is applied in a minor axis. However, when a material is designed to form a specific lattice structure, a negative Poisson's ratio can be realized macroscopically even when a structural material has a positive Poisson's ratio.

Figure 2:
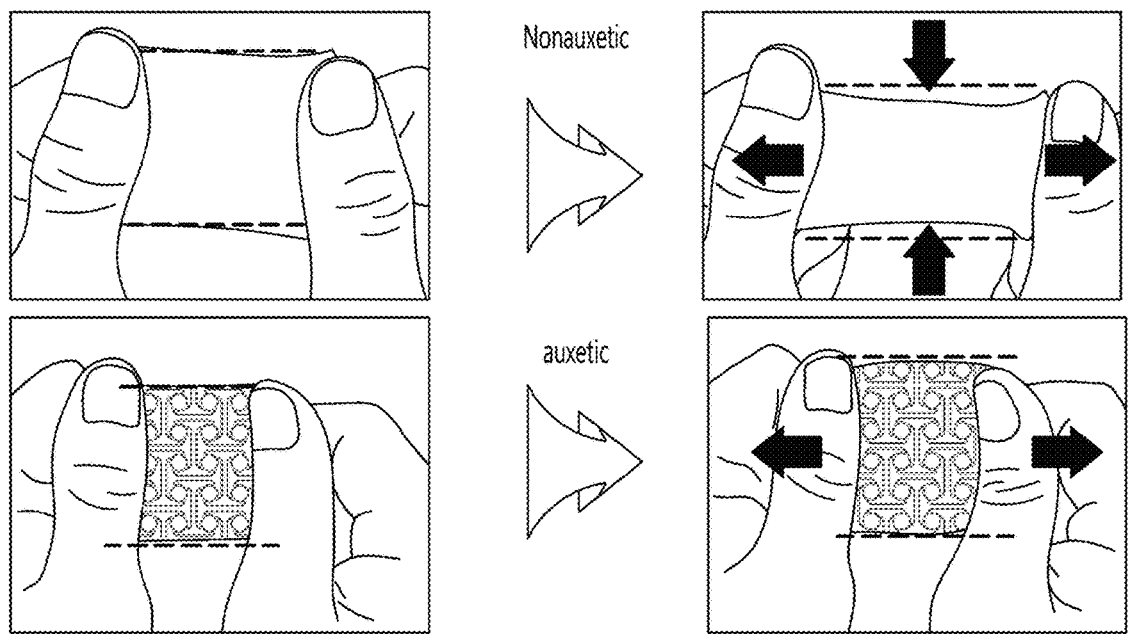
FIG. 2 shows exemplary diagrams for describing deformation in one axial direction occurring in relation to an external force generated in another axial direction when a stretchable substrate according to one embodiment of the present disclosure is implemented with an auxetic structure.

For a specific example, referring to FIG. 2, in a material having a general non-auxetic structure, when stress is applied in a transverse direction, the material expands in the transverse direction and contracts in a longitudinal direction at the same time. That is, a Poisson's ratio of longitudinal deformation and transverse deformation due to a vertical stress generated inside the material may be positive.

On the other hand, in a material having an auxetic structure, when stress is applied in a transverse direction, the material may expand in both transverse and longitudinal directions. That is, a Poisson's ratio due to vertical stress generated inside the material may be negative.

According to one embodiment of the present disclosure, the auxetic 10 for forming the stretchable substrate 100 may be formed through a printing process using an elastic material. According to one embodiment, the auxetic 10 may be formed by performing a process of forming an elastic sheet 20 and performing a printing process on one surface of the formed elastic sheet 20. The elastic sheet 20 may be provided to support the auxetic 10 in a process of forming the auxetic 10, may be provided in a shape of a thin film, and may constitute a portion of the stretchable substrate 100 after the printing process. That is, a plurality of unit structures having a specific shape may be formed (or stacked) on an upper portion of the elastic sheet 20 using the elastic sheet 20 as a support through a printing process using an elastic material, thereby forming the auxetic 10.

In addition, according to another embodiment, a printing process may be performed on one surface of a fixing surface, and after curing, the fixing surface is separated, thereby forming the auxetic 10 of the present disclosure. The fixing surface may be provided to temporarily support the auxetic 10 in a process of forming the auxetic 10 and may be separated from the auxetic 10 after the printing process. That is, the auxetic 10 may be formed by performing a printing process using the separate fixing surface different from components constituting the stretchable substrate 100, and the auxetic 10 of the present disclosure may be formed through a process of separating the formed auxetic 10 from the fixing surface.

In other words, the process of forming the auxetic 10 in the present disclosure may include at least one of a process of performing a printing process on the elastic sheet 20 made of a thin elastic body (that is, a process in which an elastic sheet used as a support is included in a stretchable substrate) and a process of forming the auxetic 10 using a flat fixing surface and separating the auxetic 10 from the corresponding fixing surface after curing to obtain the auxetic (that is, a process of separating a separate support to prepare only the auxetic).

The printing process in the present disclosure may be a process of printing a target object with a designed circuit pattern through an inkjet printer, a laminator, or the like and may refer to a roll-to-roll process of forming (or stacking) a specific lattice structure (that is, a plurality of unit structures having a specific shape) through a stretchable or elastic material. Such a printing process may refer to a process using a device such as an inkjet device, a pneumatic dispenser, a screw dispenser, a screen printing device, a bar coater, or a spray printing device. The detailed description of the devices used in the above-described printing process is merely an example, and the present disclosure is not limited thereto.

That is, the auxetic 10 constituting the stretchable substrate 100 of the present disclosure may be formed through a printing process using an elastic material. In other words, through the printing process, it is possible to form the auxetic corresponding to an interval and size of several tens to several hundreds of microns. Thus, it is possible to provide a high degree of freedom in design and a high degree of freedom in material selection and concurrently provide high efficiency in a large-area process.

As described above, unlike general materials, the auxetic 10 of the present disclosure may refer to a material that has a negative Poisson's ratio, that is, the material is designed such that a transverse strain and a longitudinal strain have the same sign. In other words, the stretchable substrate 100 of the present disclosure is formed through the auxetic 10 which is a mechanical metamaterial designed in a specific lattice structure, thereby controlling the stretchable substrate 100 to have a negative Poisson's ratio or a strain in a direction perpendicular to a stretching direction. The Poisson's ratio is an inherent characteristic in a material but is controllable by forming a specific structure in the material.

Figure 3:
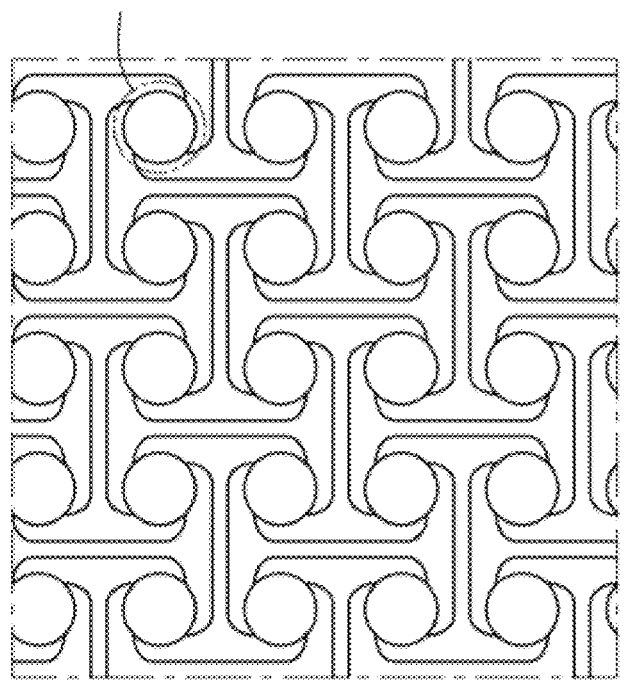
FIG. 3 is an exemplary diagram illustrating one or more auxetic structures.

An auxetic structure in which a Poisson's ratio is adjustable to a negative value may include, for example, an auxetic structure including a plurality of unit structures corresponding to a chiral structure as shown in FIGS. 1 to 3.

FIG. 3 is an exemplary diagram exemplarily illustrating an auxetic 10 provided with a chiral structure. When the auxetic 10 is provided with the chiral structure, a shape of each of a plurality of unit structures may be a circular shape as shown in FIG. 3. Specifically, when an external force is applied to the auxetic 10 having the chiral structure in a longitudinal direction (that is, when the auxetic 10 expands or contracts in the longitudinal direction), each of the plurality of unit structures provided in a shape corresponding to the chiral structure may be rotated in a clockwise or counterclockwise direction to spread the auxetic 10, and accordingly, the corresponding auxetic may have a negative Poisson's ratio. Each of the plurality of unit structures may cause the deformation of the auxetic in one axial direction in response to an external force generated in another axial direction. Since each of the plurality of unit structures provided in the auxetic 10 is implemented with a wound shape, when an external force is applied in one axial direction, a strain in another axial direction may be controlled.

That is, a stretchable substrate 100 implemented using the auxetic 10 may be a substrate to which unique mechanical properties that do not exist in nature are given by using a new structure. The stretchable substrate 100 may have high applicability in various fields. For example, the stretchable substrate 100 of the present disclosure may be applied to a flexible device, a wearable device, or the like and used to maintain electrical or physical properties of an element against external stress. For another example, when the stretchable substrate 100 of the present disclosure is used in a display field, the stretchable substrate 100 may support deformation in a multidimensional axis direction under various conditions, in addition to a fixed display that is folded or rolled in a single direction. Thus, higher variability may be provided to improve a degree of freedom in design and also secure mechanical stability against an external force.

In a display implemented using the stretchable substrate 100 having such an auxetic structure, a negative Poisson's ratio may be controlled in terms of the entirety of the substrate, but when the substrate expands or contracts, stress may be non-uniform for each pixel section. Specifically, in the case of a stretchable substrate using an auxetic structure, when the stretchable substrate is stretched, a strain may be controlled in an in-plane direction perpendicular to a stretching direction, but respective pixel sections may have different elongations.

That is, since the respective pixel sections have different tensile elongations, stress may be non-uniformly distributed according to each area constituting a surface, which may result in distortion of an image output on the display.

Figure 4:
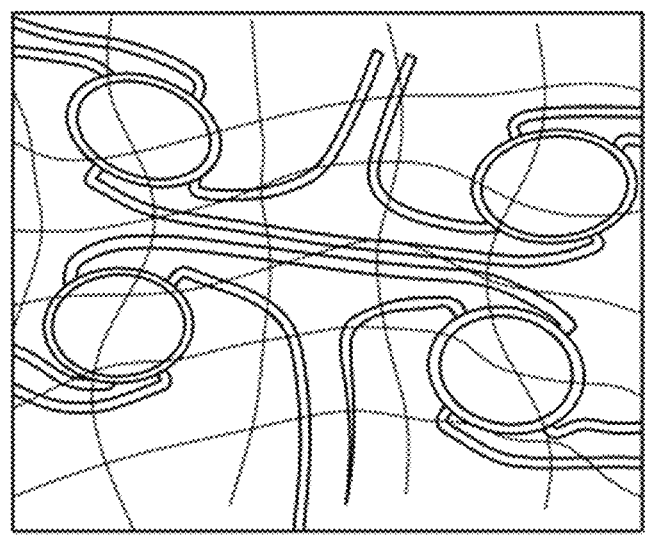
FIG. 4 is a diagram exemplarily illustrating that an elongation distribution is not uniform when an auxetic is stretched according to one embodiment of the present disclosure.
Figure 5:
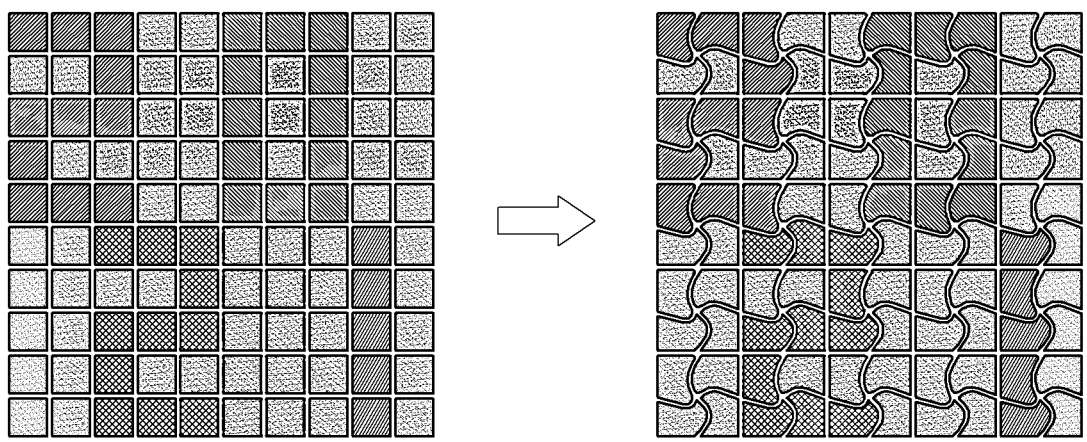
FIG. 5 shows diagrams exemplarily illustrating display distortion that occurs when a tensile elongation distribution is not uniform within a substrate according to one embodiment of the present disclosure.

Referring to FIGS. 4 and 5 for more detailed description, when the stretchable substrate 100 is implemented using the auxetic 10 having the chiral structure, since a Poisson's ratio is controllable to a negative value, the stretchable substrate 100 may expand or remain unchanged in one axial direction in response to an external force generated in another axial direction on a plane. That is, when expansion and contraction occur in one axial direction, expansion and contraction may be caused in an in-plane direction perpendicular to the stretching direction.

However, when the auxetic 10 having the chiral structure is simply embedded in an elastic substrate to implement a stretchable substrate, stress may be non-uniform for each section constituting a surface. For example, when two elastic sheets are in full contact with both surfaces of the auxetic 10 including a plurality of unit structures to form a stretchable substrate, and when stretching occurs in one direction, strains applied to the unit structures may be different. Therefore, stress may not be uniform for each pixel section. For example, while spreading in response to stretching in one direction, each unit structure may be stretched in an in-plane direction perpendicular to the one direction. However, in this case, since a motion of each unit structure is different for each section, each unit structure may be distorted or rotated, and thus, an overall strain may be different for each pixel section. As a specific example, as shown in FIG. 4B, each unit structure may be stretched in an in-plane direction perpendicular to the one direction while being rotated to spread in response to stretching in one direction. In this case, as described above, an overall strain may be not uniform for each pixel section.

That is, as shown in FIG. 4, when each auxetic 10 expands or contracts in one axial direction, according to a shape of each unit structure (for example, a circular shape corresponding to a chiral structure), distortion may be caused in another axial direction, or overall distortion may be caused.

Accordingly, when a display is implemented using the stretchable substrate 100 implemented using the corresponding auxetic, as shown in FIG. 5, each square pixel may be distorted, and thus, an overall image may be distorted.

Additionally, there is a risk of affecting the performance of display-related elements disposed adjacent to a substrate surface. Thus, as the mechanical separation of an element positioned on a stretchable substrate is accelerated, there is a risk of reducing a life time of the element. In particular, when the performance of an element is directly affected by a shape of a surface as in a display or a solar cell, a solution to a corresponding issue may be required.

According to the present disclosure, since the stretchable substrate 100 is implemented using the auxetic 10, when the stretchable substrate 100 is provided to have a negative Poisson's ratio, it is possible to minimize distortion for each pixel section of the stretchable substrate 100. Specifically, in the stretchable substrate 100 of the present disclosure, each elastic sheet may be selectively bonded to a portion of each of both surfaces of the auxetic 10 to control the uniformity of a strain for each pixel of the corresponding stretchable substrate 100.

Specifically, the stretchable substrate 100 having improved stretch uniformity may be implemented through selective bonding of the auxetic 10 and one or more elastic sheets 20. Here, the selective bonding means that each of two elastic sheets is not entirely bonded to correspond to the total area of one of both surfaces of the auxetic 10 implemented with a plurality of unit structures having a specific shape and each of the plurality of unit structures is bonded to a portion of each elastic sheet. For example, the selective bonding may mean that each elastic sheet is bonded to a partial area of each of both surfaces of the auxetic 10, that is, a central portion of each unit structure.

That is, the stretchable substrate 100 of the present disclosure may be formed by coupling of one or more elastic sheets 20 centered on a central hole 10b of each unit structure according to a provided shape of a unit structure. For example, the stretchable substrate 100 may be formed by selectively bonding one or more elastic sheets 20 based on each central hole 10b corresponding to one unit structure included in the auxetic 10.

In other words, in the stretchable substrate 100 of the present disclosure, both surfaces of the auxetic 10 may be partially and selectively bonded to each elastic sheet rather than entirely bonded to each elastic sheet. Accordingly, a selectively bonded portion can apply a uniform strain to an entire substrate when expanding and contracting. Thus, by improving flatness, pixel distortion of a stretchable display can be reduced, element performance can be maintained, and element separation can be minimized, thereby improving the overall stability of a stretchable electronic device.

That is, the stretchable substrate 100 may have high applicability in various fields, and in particular, in relation to a stretchable display field, the stretchable substrate 100 may have a uniform strain for each pixel section. Thus, it is possible to minimize distortion occurring when the stretchable substrate 100 expands or contracts in one direction. More specific methods of manufacturing the stretchable substrate 100 of the present disclosure, structural features thereof, and effects thereof will be described below with reference to FIGS. 6 to 13.

Figure 6:
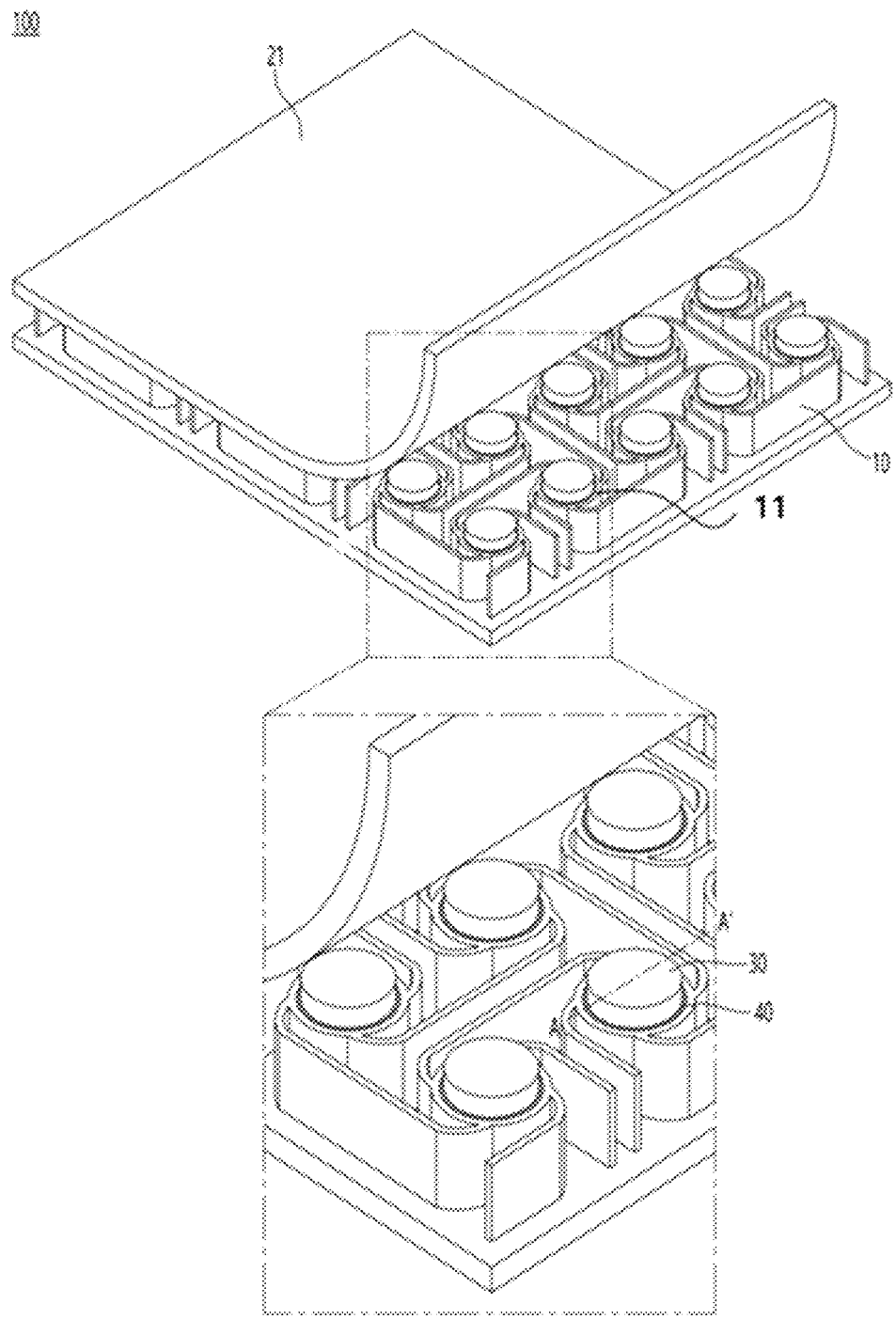
FIG. 6 shows diagrams exemplarily illustrating a stretchable substrate formed through selective bonding of an auxetic having a chiral structure and an elastic substrate according to one embodiment of the present disclosure.
Figure 7:
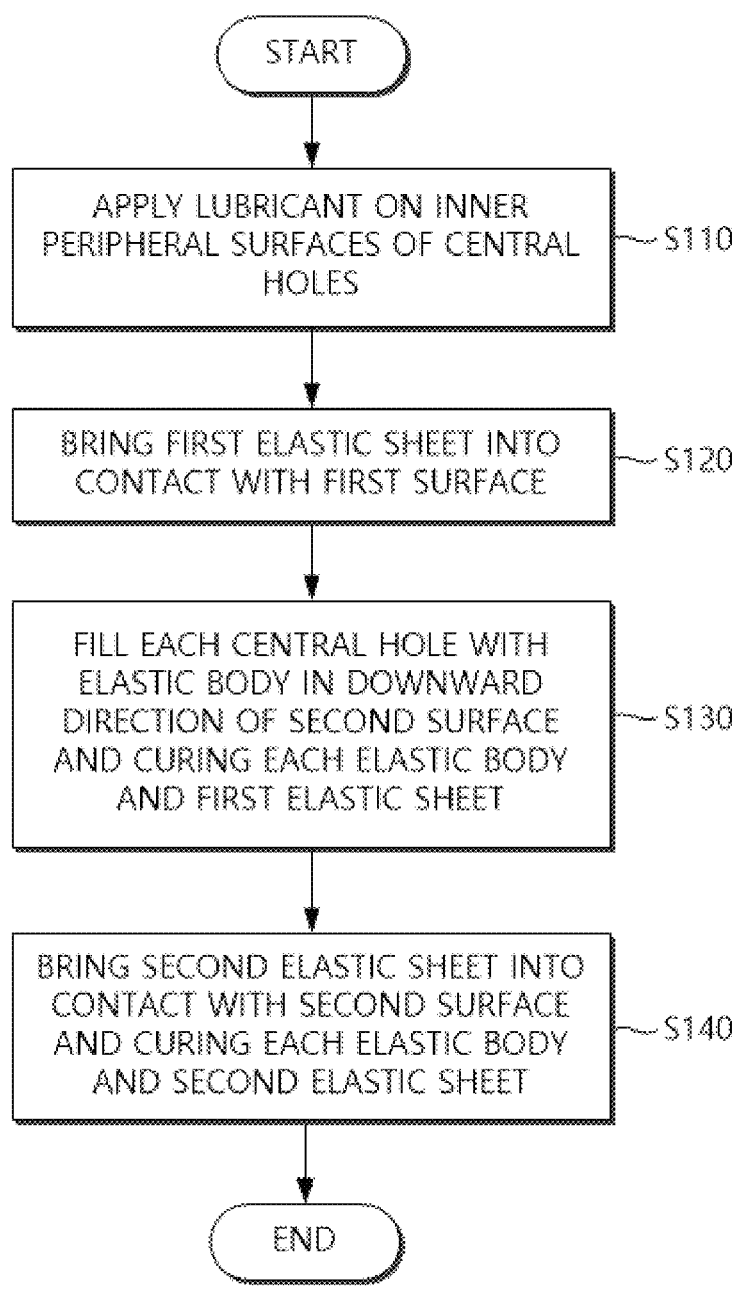
FIG. 7 is a flowchart exemplarily illustrating a method of manufacturing a stretchable substrate using a lubricant according to one embodiment of the present disclosure.
Figure 8:
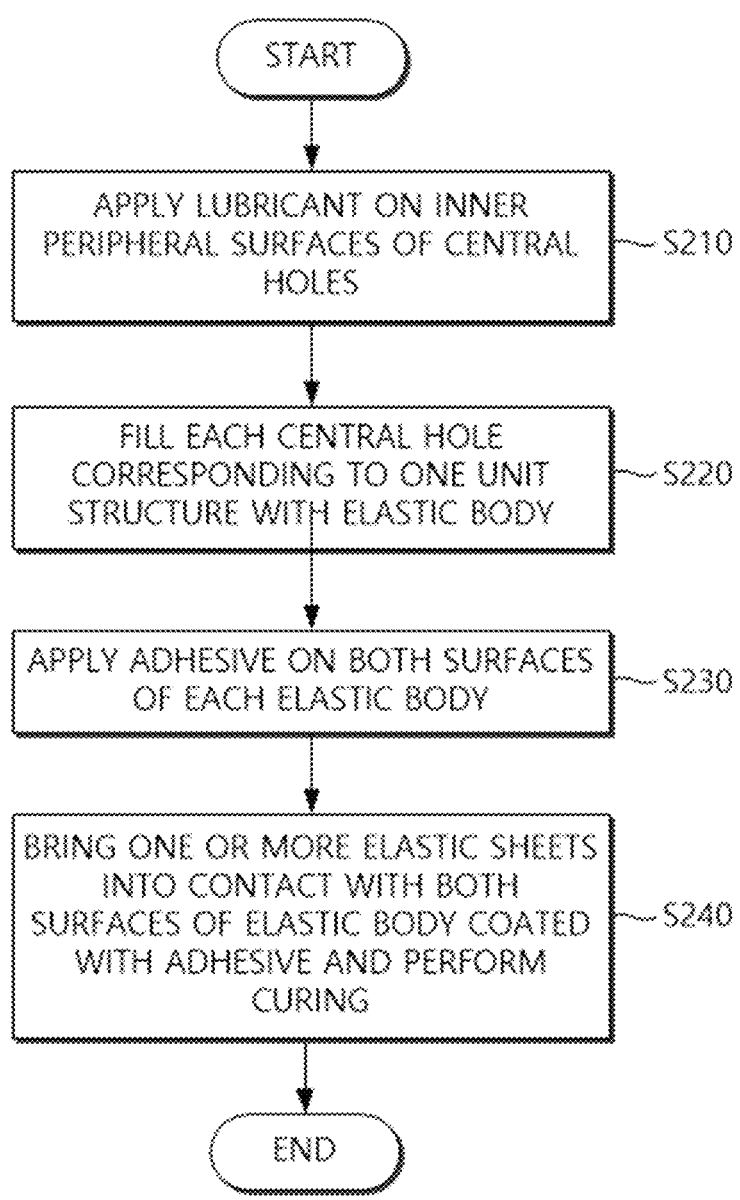
FIG. 8 is a flowchart exemplarily illustrating a method of manufacturing a stretchable substrate using a lubricant according to another embodiment of the present disclosure.
Figures 9A, 9B:
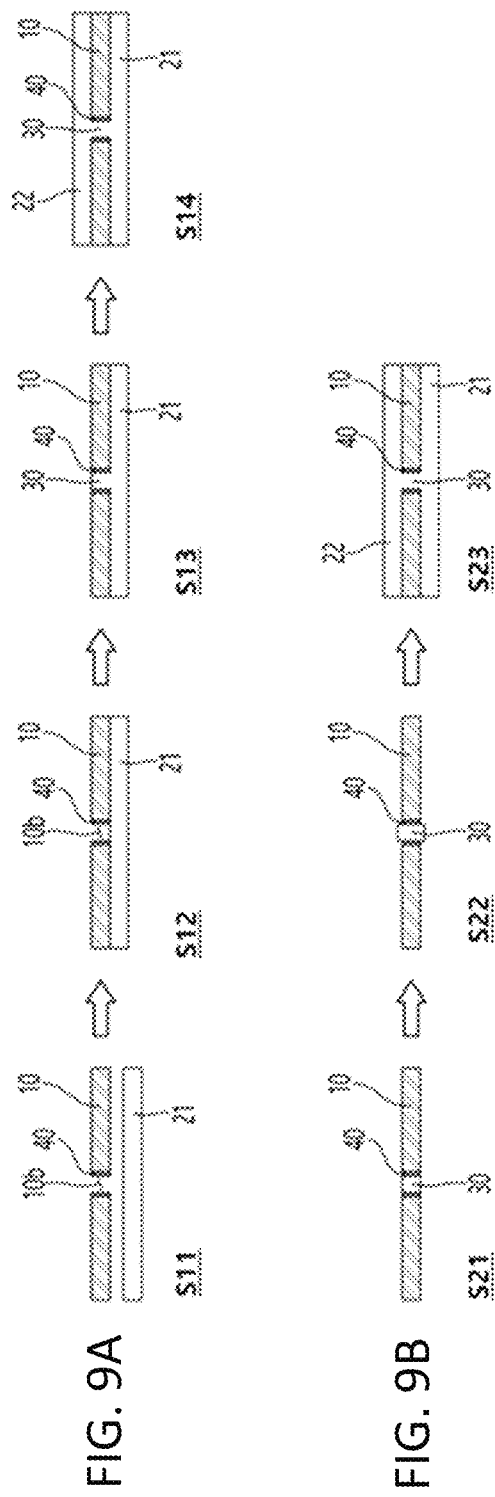
FIGS. 9A and 9B show exemplary diagrams exemplarily illustrating processes of manufacturing a stretchable substrate based on an auxetic having a chiral structure according to one embodiment of the present disclosure.
Figure 10:
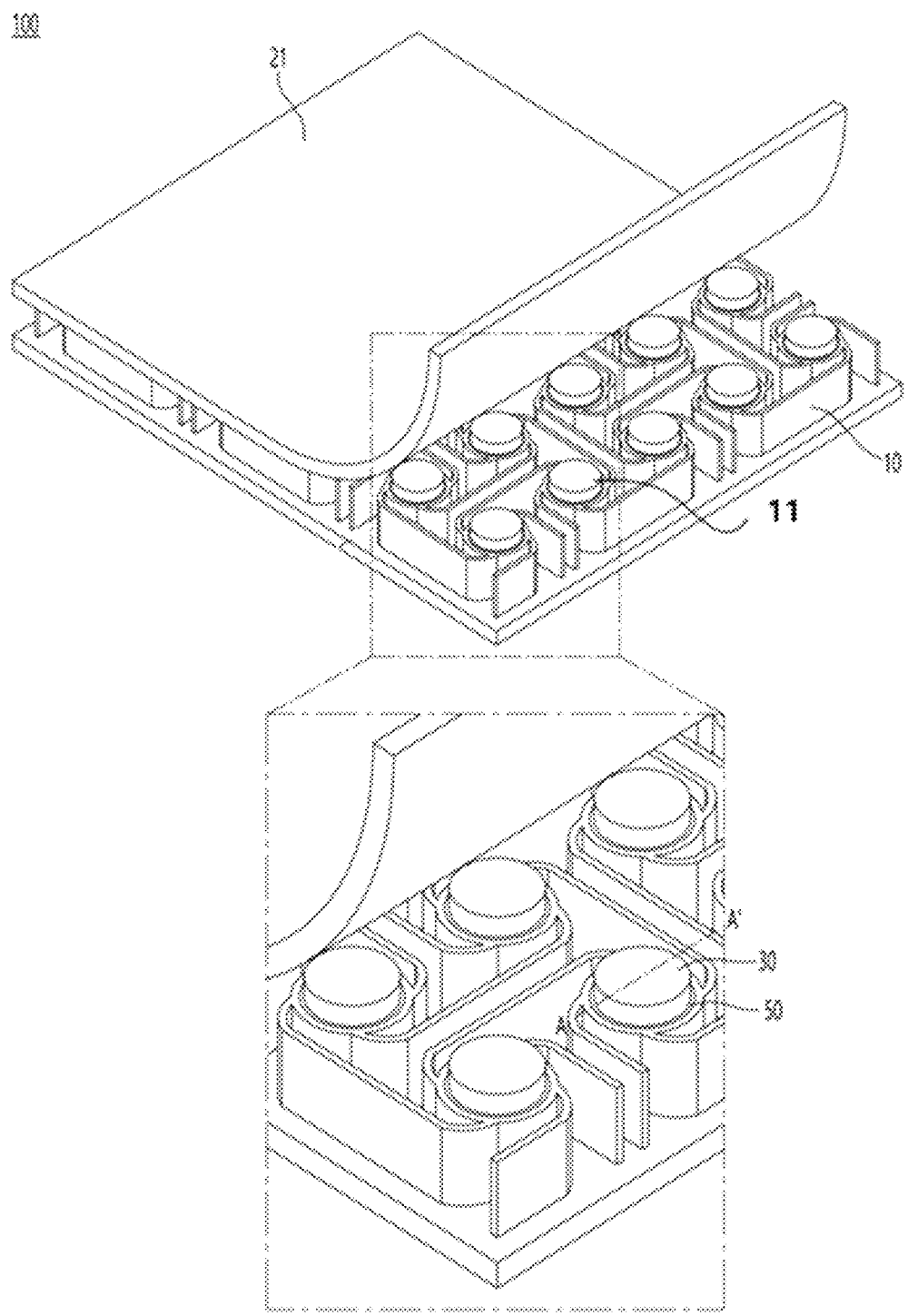
FIG. 10 shows diagrams exemplarily illustrating a stretchable substrate formed through selective bonding of an auxetic having a chiral structure and an elastic substrate according to another embodiment of the present disclosure.
Figure 11:
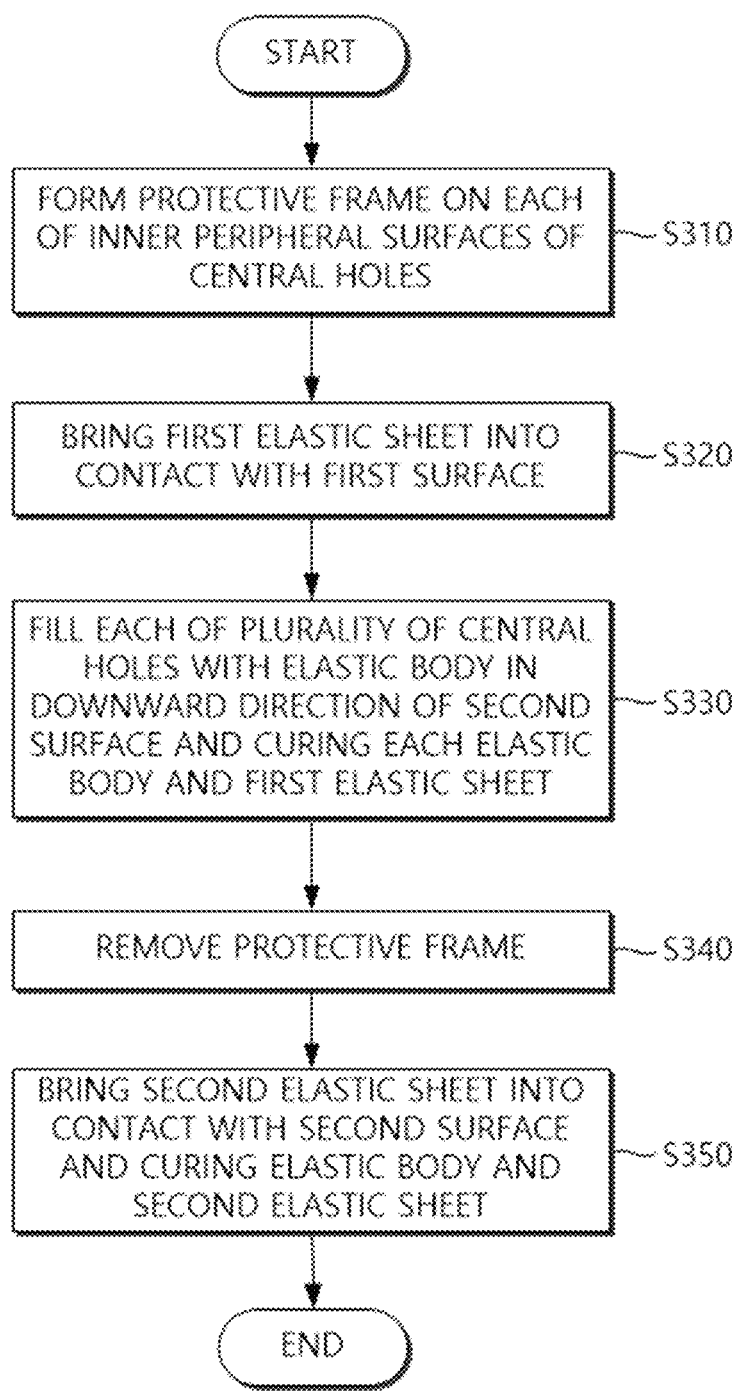
FIG. 11 is a flowchart exemplarily illustrating a method of manufacturing a stretchable substrate by forming an air gap according to one embodiment of the present disclosure.
Figure 12:
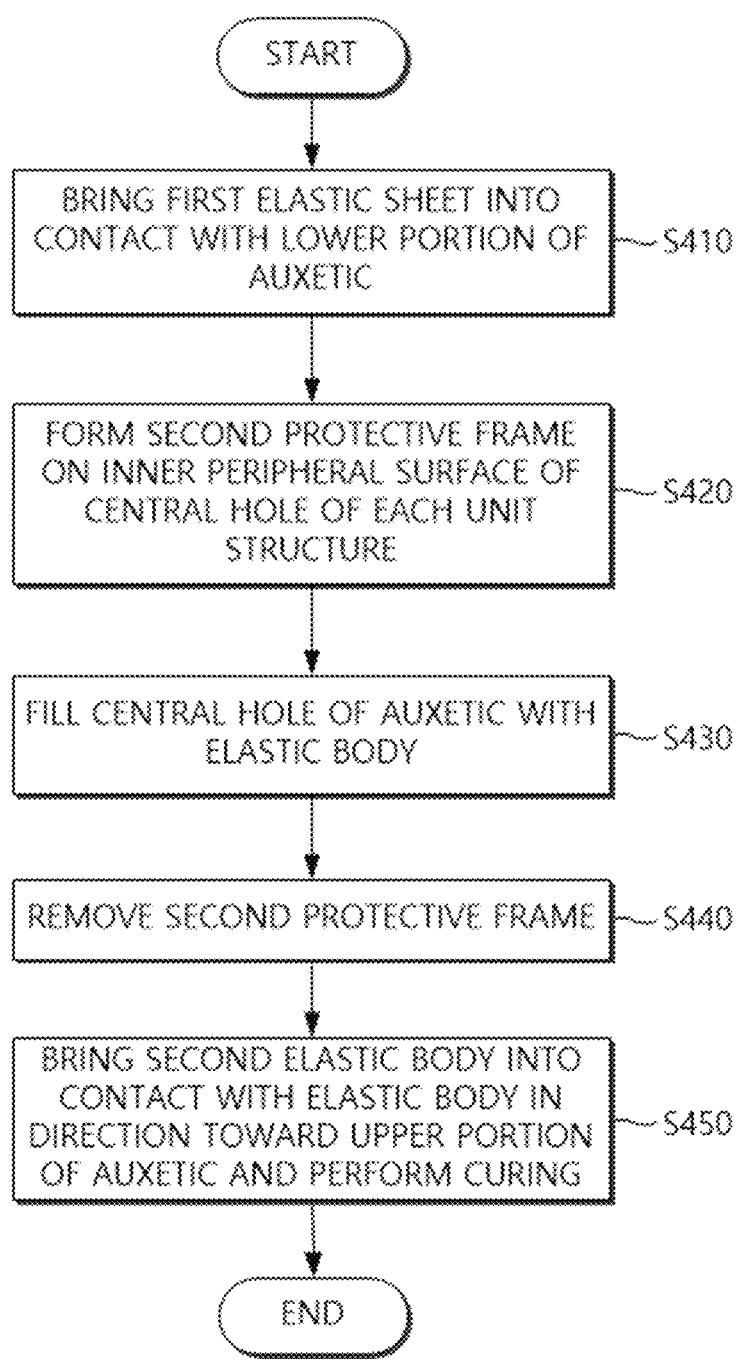
FIG. 12 is a flowchart exemplarily illustrating a method of manufacturing a stretchable substrate by forming an air gap according to another embodiment of the present disclosure.

FIG. 6 shows diagrams exemplarily illustrating a stretchable substrate formed through selective bonding of an auxetic having a chiral structure and an elastic substrate according to one embodiment of the present disclosure. FIG. 7 is a flowchart exemplarily illustrating a method of manufacturing a stretchable substrate using a lubricant according to one embodiment of the present disclosure. FIG. 8 is a flowchart exemplarily illustrating a method of manufacturing a stretchable substrate using a lubricant according to another embodiment of the present disclosure. FIGS. 9A and 9B show exemplary diagrams exemplarily illustrating processes of manufacturing a stretchable substrate based on an auxetic having a chiral structure according to one embodiment of the present disclosure. FIG. 10 shows diagrams exemplarily illustrating a stretchable substrate formed through selective bonding of an auxetic having a chiral structure and an elastic substrate according to another embodiment of the present disclosure. FIG. 11 is a flowchart exemplarily illustrating a method of manufacturing a stretchable substrate by forming an air gap according to one embodiment of the present disclosure. FIG. 12 is a flowchart exemplarily illustrating a method of manufacturing a stretchable substrate by forming an air gap according to another embodiment of the present disclosure. FIGS. 13A and 13B show exemplary diagrams illustrating processes of manufacturing a stretchable substrate based on an auxetic having a chiral structure according to another embodiment of the present disclosure.

As shown in FIG. 6, a stretchable substrate 100 may include an auxetic 10 including a plurality of unit structures and one or more elastic sheets 20. For example, the plurality of unit structures constituting the auxetic 10 may be provided to have a shape corresponding to a chiral structure. FIG. 6 exemplarily illustrates a case in which, when the auxetic is formed in the chiral structure, each of the plurality of unit structures has a shape (for example, a circular shape) corresponding to the chiral structure.

The stretchable substrate 100 of the present disclosure may include the auxetic 10 including the plurality of unit structures having the circular shape and one or more elastic sheets 20 attached to both surfaces of the auxetic 10. In the present disclosure, one or more elastic sheets 20 may be formed to have a predetermined thickness or less and bonded to one or more surfaces of the auxetic 10. The elastic sheet may be provided to have a certain elastic force or more so as to expand and contract.

As shown in FIG. 6, the stretchable substrate 100 may be formed by bonding of each of one or more elastic sheets centered on a central hole 10*b* of each of the plurality of unit structures constituting the auxetic 10. Here, when, due to the auxetic 10 being implemented with the chiral structure, each of the plurality of unit structures has the circular shape corresponding to the chiral structure, the central hole 10*b* may be a point related to a portion at which the elastic sheets are connected and coupled to each other. That is, as shown in FIG. 6, the central hole 10*b* may be a point related to the bonding of each of one or more elastic sheets 20 and may be a point related to a central portion of each unit structure.

According to one embodiment of the present disclosure, an operation of forming a stretchable substrate may include filling a plurality of central holes related to central portions of a plurality of unit structures with an elastic body and attaching one or more elastic sheets to the elastic body corresponding to each central hole to form a stretchable substrate.

For a specific example, referring to FIG. 6, based on a first unit structure 11 among the plurality of unit structures constituting the auxetic 10, the central hole 10*b* may be formed in a central portion of the first unit structure 11.

That is, one or more elastic sheets 20 may be coupled to each other based on the central hole 10*b* related to the central portion of each unit structure. For example, the central hole 10*b* related to the central portion may be filled with an elastic body 30 having a cylindrical shape, and one or more elastic sheets 20 may be coupled to each other through the elastic body 30.

In other words, a first elastic sheet 21 and a second elastic sheet 22 may be coupled to each other based on the central hole 10*b* of each unit structure to constitute the stretchable substrate 100. Accordingly, when the auxetic 10 having the chiral structure is stretched, the elastic sheet attached to each of both surfaces thereof may not be affected by a portion spread due to the rotation of each unit structure. For example, as shown in FIG. 4, when the substrate is stretched, due to the rotation of each unit structure, different stress may not act for each pixel section.

That is, rather than areas in which, due to stretching, different stresses are generated according to the rotation of each unit structure, each elastic sheet is selectively attached based on a central area (that is, the central hole) of each unit structure to constitute the stretchable substrate 100. Thus, the elastic sheet constituting a surface moves uniformly in directions of one axis (for example, an x-axis) and another axis (for example, a y-axis) in response to stretching in a specific axial direction, and more uniform strain control is possible.

As described above, one or more elastic sheets may be bonded based on a plurality of central holes 10*b* included in the auxetic 10 including the plurality of unit structures having a shape corresponding to the chiral structure, thereby forming the stretchable substrate 100.

According to one embodiment of the present disclosure, as shown in FIG. 7, a method of forming a stretchable substrate 100 may include operation S110 of applying a lubricant on inner peripheral surfaces of central holes 10*b*, operation S120 of bringing a first elastic sheet 21 into contact with a first surface, operation S130 of filling each central hole 10*b* with an elastic body in a downward direction of a second surface and curing each elastic body 30 and the first elastic sheet 21, and operation S140 of bringing a second elastic sheet 22 into contact with the second surface and curing each elastic body 30 and the second elastic sheet 22. In this case, a lubricant 40 may be provided between a unit structure and the elastic body. The lubricant 40 may be provided between each of a plurality of unit structures and the elastic body 30 provided at a central portion of each unit structure, and when the unit structure is spread and rotated according to stretching, the lubricant 40 may allow each elastic body 30 and each unit structure (that is, an auxetic) to slide. That is, the lubricant 40 may be provided to minimize friction between an auxetic 10 and the elastic body 30 provided in a portion of the auxetic 10. When the auxetic 10 is deformed in response to stretching in various axial directions, due to the lubricant 40, separate stress is not applied to the elastic body 30. That is, through the lubricant 40, the elastic body 30 and the auxetic 10 may be slidably provided. Thus, the elastic body 30 and the auxetic 10 may be moved independently from each other, thereby being controlled to be uniformly deformed in response to expansion and contraction.

Referring to FIG. 9A for more detailed description, in operation S11, the lubricant 40 may be applied on a portion of the auxetic 10. Specifically, the lubricant 40 may be applied on the central portion of the unit structure. That is, the lubricant 40 may be applied on an inner peripheral surface of the unit structure related to the central hole 10*b*. In addition, in operation S12, the first elastic sheet 21 may be brought into contact with a lower portion of the auxetic 10. Furthermore, in operation S13, the elastic body 30 may fill the central hole 10*b* of the auxetic 10. Specifically, based on the corresponding drawing, the elastic body 30 in a liquid state may be supplied in an upward direction, that is, toward the second surface opposite to the first surface in contact with the first elastic sheet 21. In this case, since the first elastic sheet 21 is provided in contact with the first surface, the elastic body 30 may fill the corresponding central hole 10*b* without being discharged in an opposite direction. Thereafter, the elastic body 30 may be coupled to the first elastic sheet 21 through curing. In addition, in operation S14, the second elastic sheet 22 may be brought into contact with the elastic body 30 in the downward direction of the second surface of the auxetic 10 to perform curing related to the coupling of the elastic body and the second elastic sheet 22. Accordingly, the first elastic sheet 21 and the second elastic sheet 22 may be coupled to one surface and the other surface of the elastic body 30, respectively. That is, the elastic body 30 may fill a hollow inner cylinder of each unit structure, and the elastic sheets may be coupled to each other based on both surfaces of the elastic body 30. In other words, the first elastic sheet 21 and the second elastic sheet 22 may be coupled to each other based on the elastic body 30 provided in the central portion (that is, the central hole) of each unit structure. In this case, the lubricant 40 may be provided between the unit structure and the elastic body. The lubricant 40 may be provided between each of the plurality of unit structures and the elastic body 30 provided at the central portion of each unit structure, and when the unit structure is rotated according to stretching, the lubricant 40 may allow each elastic body 30 and each unit structure (that is, the auxetic) to slide relative to each other. That is, through the lubricant 40, the elastic body 30 and the auxetic 10 may be slidably provided. Thus, the elastic body 30 and the auxetic 10 may be moved independently from each other, thereby being controlled to be uniformly deformed in response to expansion and contraction.

According to another embodiment of the present disclosure, as shown in FIG. 8, an operation of forming a stretchable substrate 100 may include operation S210 of applying a lubricant on inner peripheral surfaces of central holes 10b, operation S220 of filling each central hole 10b corresponding to one unit structure with an elastic body 30, operation S230 of applying an adhesive on both surfaces of each elastic body, and operation S240 of bringing one or more elastic sheets 20 into contact with the both surfaces of the elastic body coated with the adhesive and performing curing.

Referring to FIG. 9B for more detailed description, in operation S21, a lubricant 40 may be applied on an inner peripheral surface of a central portion of the unit structure, and the elastic body 30 may fill the inside of the unit structure on which the lubricant 40 is applied. In addition, in operation S22, the adhesive may be applied on each of an upper surface and a lower surface of the elastic body 30. In other words, the adhesive may be applied on both surfaces of the elastic body 30. In addition, in operation S23, a first elastic sheet 21 and a second elastic sheet 22 may be brought into contact with both surfaces of the elastic body 30 coated with the adhesive to perform curing.

As described above, when each of the plurality of unit structures included in an auxetic 10 has a shape (for example, a circular shape) corresponding to a chiral structure, the elastic body 30 may be provided in relation to the central hole 10b of each unit structure, and the lubricant 40 may be provided between the auxetic (or each unit structure) and the elastic sheet. Thus, the elastic sheet related to a surface moves uniformly in directions of one axis (for example, an x-axis) and another axis (for example, a y-axis) in response to stretching in a specific axial direction, and more uniform strain control is possible.

As shown in FIG. 10, stretchable substrate 100 may be formed by bonding of each of one or more elastic sheets 20 centered on a central hole 10b of each of a plurality of unit structures constituting an auxetic 10. The stretchable substrate 100 may be formed by bonding of each of one or more elastic sheets 20 based on an elastic body 30 provided to pass through a portion of the auxetic 10. The stretchable substrate 100 may be formed so as to form an air gap between the auxetic 10 and the elastic body 30 provided to pass through the auxetic 10.

That is, the elastic body 30 may fill a central portion of each unit structure, that is, the central hole 10b, and one or more elastic sheets 20 may be coupled to each other based on the filled elastic body 30 to constitute the stretchable substrate 100. In this case, an air gap 50 formed between the auxetic 10 and the elastic body 30 may be formed to remove friction that may occur between the auxetic 10 and the elastic body 30 provided so as to pass through a portion of the auxetic 10. When the auxetic 10 is deformed in response to stretching in various axial directions, due to the air gap 50, separate stress is not applied to the elastic body 30. That is, due to the air gap 50, the elastic body 30 and the auxetic 10 may be provided so as to not interfere with each other. Thus, the elastic body 30 and the auxetic 10 may be moved independently from each other, thereby being controlled to be uniformly deformed in response to expansion and contraction.

Accordingly, when the auxetic 10 having a chiral structure is stretched, the elastic sheet 20 attached to each of both surfaces thereof may not be affected by a portion spread due to the rotation of each unit structure. For example, as shown in FIG. 4, when the substrate is stretched, due to the rotation of each unit structure, different stress may not act for each pixel section.

That is, rather than areas in which, due to stretching, different stresses are generated according to the rotation of each unit structure, each elastic sheet is selectively attached based on a central area (that is, the central hole) of each unit structure to constitute the stretchable substrate 100. Thus, the elastic sheet constituting a surface moves uniformly in directions of one axis (for example, an x-axis) and another axis (for example, a y-axis) in response to stretching in a specific axial direction, and more uniform strain control is possible.

According to one embodiment of the present disclosure, as shown in FIG. 11, a method of forming a stretchable substrate 100 may include operation S310 of forming a protective frame on each of inner peripheral surfaces of central holes 10b, operation S320 of bringing a first elastic sheet 21 into contact with a first surface, operation S330 of filling each of the plurality of central holes 10b with an elastic body in a downward direction of a second surface and curing each elastic body 30 and the first elastic sheet 21, operation S340 of removing the protective frame, and operation S350 of bringing a second elastic sheet 22 into contact with the second surface and curing the elastic body 30 and the second elastic sheet 22. In this case, an air gap 50 may be formed between each unit structure and the elastic body 30. According to one embodiment, the removing of the protective frame may include supplying a solvent to the central hole 10b to remove the protective frame.

In one embodiment, the protective frame may include a first protective frame 51 made of a solute dissolved through a solvent and a second protective frame 52 made of a material that is easily separated from an auxetic 10 and the elastic sheet according to curing. When the protective frame is made of various materials, a method of forming the stretchable substrate 100 including an air gap between each unit structure (for example, an auxetic) and the elastic body 30 will be described in detail below.

In one embodiment, referring to FIG. 13A, in operation S31, the first protective frame 51 may be formed on an inner peripheral surface of each unit structure. In this case, the first protective frame 51 may be made using a solute dissolved in a solvent, and the solvent may be cured after being applied in a liquid state on the inner peripheral surface of each unit structure. In addition, in operation S32, the first elastic sheet 21 may be brought into contact with a lower portion of the auxetic 10. Furthermore, in operation S33, the elastic body 30 may fill the central hole 10b of the auxetic 10. Specifically, the elastic body 30 in a liquid state may be supplied in an upward direction in the corresponding drawing, that is, toward the second surface direction corresponding to the first surface in contact with the first elastic sheet 21. In this case, since the first elastic sheet 21 is provided in contact with the first surface, the elastic body 30 may fill the corresponding central hole 10b without being discharged in an opposite direction. Thereafter, the elastic body 30 may be coupled to the first elastic sheet 21 through curing and may be in indirect contact with the auxetic 10 with the first protective frame 51 interposed therebetween.

In addition, in operation S34, a solvent may be supplied to the central hole 10b in the downward direction of the second surface, and accordingly, the first protective frame 51 may be dissolved through the corresponding solvent to form the air gap 50 between the auxetic 10 and the elastic body 30. Thereafter, in operation S35, an additional elastic body may be stacked and cured on an upper portion of the elastic body 30 (that is, toward the second surface), and thus, the elastic body 30 may be provided to protrude from a portion of the second surface. In addition, in operation S36, the second elastic sheet 22 may be brought into contact with the elastic body 30 protruding from a portion of the second surface to perform curing, thereby coupling the second elastic sheet 22 and the elastic body 30.

According to another embodiment of the present disclosure, as shown in FIG. 12, a method of forming a stretchable substrate 100 may include operation S410 of bringing a first elastic sheet into contact with a lower portion of an auxetic, operation S420 of forming a second protective frame on an inner peripheral surface of a central hole of each unit structure, operation S430 of filling a central hole of the auxetic with an elastic body, operation S440 of removing the second protective frame, and operation S450 of bringing a second elastic body into contact with the elastic body in a direction toward an upper portion of the auxetic and performing curing.

More specifically, referring to FIG. 13B, in operation S41, a first elastic sheet 21 may be brought into contact with a lower portion of an auxetic 10 to form a second protective frame 52 on an upper surface (for example, a second surface) and the inner peripheral surface of each unit structure. In this case, the second protective frame 52 may be made of a material that is easily separated from the auxetic 10 and the elastic sheet after curing is performed. For example, the second protective frame 52 in a liquid state may be supplied and applied on the upper surface and the inner peripheral surface of each unit structure in a direction toward an upper portion of the auxetic 10. In operation S42, the elastic body 30 may fill a central hole 10b of the auxetic 10. In this case, since the first elastic sheet 21 is provided in contact with a first surface, the elastic body 30 may fill the corresponding central hole 10b without being discharged in an opposite direction. Thereafter, the elastic body 30 may be coupled to the first elastic sheet 21 through curing and may be in indirect contact with the auxetic 10 with the second protective frame 52 interposed therebetween.

In addition, in operation S43, the second protective frame 52 may be removed. For example, the second protective frame 52 may be easily separated from the auxetic 10 and the elastic sheet as curing is performed. That is, the second protection frame 52 may be removed through a process of separating the second protective frame 52 from the auxetic 10 and the elastic sheet. In this case, as the second protective frame 52 is removed, an air gap 50 between the auxetic 10 and the elastic body 30 may be formed. Thereafter, in operation S44, an additional elastic body may be cured by being stacked on an upper portion of the elastic body 30 (that is, toward the second surface), and thus, the elastic body 30 may be provided to protrude from a portion of the second surface. In addition, in operation S45, a second elastic sheet 22 may be brought into contact with the elastic body 30 protruding from a portion of the second surface to perform curing, thereby coupling the second elastic sheet 22 and the elastic body 30.

As described above, the elastic body 30 may fill a hollow central portion inside each unit structure, and the elastic sheets may be coupled to each other based on both surfaces of the corresponding elastic body 30. In other words, the first elastic sheet 21 and the second elastic sheet 22 may be coupled to each other based on the elastic body 30 provided in the central portion (that is, the central hole) of each unit structure. In this case, when the auxetic 10 is deformed in response to stretching in various axial directions, due to the air gap 50, separate stress is not applied to the elastic body 30. That is, due to the air gap 50, the elastic body 30 and the auxetic 10 may be provided so as to not interfere with each other. Thus, the elastic body 30 and the auxetic 10 may be moved independently from each other, thereby being controlled to be uniformly deformed in response to expansion and contraction.

Therefore, the stretchable substrate 100 of the present disclosure may be formed by coupling one or more elastic sheets 20 based on the central hole 10b according to a provided shape of the unit structure.

In other words, in the stretchable substrate 100 of the present disclosure, the elastic sheet may not be bonded to an entire area of each of both surfaces of the auxetic 10 and may be selectively bonded to a portion of each of the both surfaces of the auxetic 10. A portion to which an elastic sheet is selectively bonded can apply a uniform strain to an entire substrate even when the substrate expands or contracts. Thus, by improving flatness, pixel distortion of a stretchable display can be reduced, element performance can be maintained, and element separation can be minimized, thereby improving the overall stability of a stretchable electronic device.

That is, the stretchable substrate 100 may have high applicability in various fields, and in particular, in relation to a stretchable display field, the stretchable substrate 100 may have a uniform strain for each pixel section. Thus, it is possible to minimize distortion occurring when the stretchable substrate 100 expands or contracts in one direction.

According to various embodiments of the present disclosure, it is possible to provide a stretchable substrate in which a stretchable substrate having a negative Poisson's ratio is provided to control a strain in an in-plane direction perpendicular to a stretching direction and concurrently to minimize a distortion and a warpage by uniformizing a tensile elongation distribution in the substrate.

Effects of the present disclosure may not be limited to the above, and other effects of the present disclosure will be clearly understandable to those having ordinary skill in the art from the disclosures provided below together with accompanying drawings.

Although the embodiments of the present disclosure have been described with reference to the accompanying drawings, it should be understood that those skilled in the art can carry out other modifications without changing the technical spirit or essential features of the present disclosure. Therefore, it should be understood that the embodiments described herein are illustrative and not restrictive in all aspects.

Particular implementations described in the present disclosure are exemplary and do not limit the scope of practiced embodiments. For conciseness of the specification, the description of conventional electronic configurations, control systems, software, and other functional aspects of systems may be omitted. Moreover, connections of lines or connecting elements between components shown in the accompanying drawings may represent functional connections and/or physical or circuit connections and may represent various kinds of replaceable or additional functional connections, physical connections, or circuit connections in an actual device. Furthermore, when not specifically described using terms such as "essentially" or "importantly," elements described in the specification may not be necessarily required for application of the present disclosure.

It will be appreciated that a specific order or a hierarchical structure of steps in the presented processes and methods is one example of exemplary approaches. It will be appreciated that the specific order or the hierarchical structure of the steps in the processes within the scope of the present disclosure may be rearranged based on design priorities. Appended method claims provide elements used in various steps in a sample order, but this does not mean that the method claims are limited to the presented specific order or hierarchical structure.

The description of the presented embodiments is provided so that those skilled in the art of the present disclosure may use or implement the present disclosure. Various modifications of the embodiments will be apparent to those skilled in the art of the present disclosure, and general principles defined herein can be applied to other embodiments without departing from the scope of the present disclosure. Therefore, the present disclosure is not limited to the embodiments presented herein but should be interpreted within the widest range which is associated with the principles and new features presented herein.

What is claimed is:

1. A method of manufacturing a stretchable substrate having improved stretch uniformity, the method comprising:
   forming an auxetic including a plurality of unit structures; and
   attaching one or more elastic sheets to the auxetic and forming a stretchable substrate,
   wherein the forming of the auxetic includes forming the auxetic which includes the plurality of unit structures having a shape corresponding to a chiral structure,
   wherein the forming of the stretchable substrate includes:
   filling a plurality of central holes related to central portions of the plurality of unit structures with elastic bodies; and
   attaching the one or more elastic sheets to an elastic body corresponding to each of the central holes to form the stretchable substrate, and
   wherein:
   the one or more elastic sheets include a first elastic sheet attached to a first surface of the auxetic and a second elastic sheet attached to a second surface opposite to the first surface;
   the forming of the stretchable substrate includes applying a lubricant on an inner peripheral surface of the central hole, bringing the first elastic sheet into contact with the first surface, filling each of the plurality of central holes with the elastic body in a downward direction of the second surface and curing each of the elastic bodies and the first elastic sheet, and bringing the second elastic sheet into contact with the second surface and curing each of the elastic bodies and the second elastic sheet; and
   the lubricant is provided between the unit structure and the elastic body.

2. The method of claim 1, wherein, in response to an external force generated in one axial direction, each of the plurality of unit structures causes deformation of the auxetic in another axial direction.

3. The method of claim 1, wherein the forming of the auxetic includes performing a printing process using an elastic material.

4. The method of claim 1, wherein the elastic body includes an elastic material having an elastic force and is made of the same material as the elastic sheet.

5. A method of manufacturing a stretchable substrate having improved stretch uniformity, the method comprising:
   forming an auxetic including a plurality of unit structures; and
   attaching one or more elastic sheets to the auxetic and forming a stretchable substrate,
   wherein the forming of the auxetic includes forming the auxetic which includes the plurality of unit structures having a shape corresponding to a chiral structure,
   wherein the forming of the stretchable substrate includes:
   filling a plurality of central holes related to central portions of the plurality of unit structures with elastic bodies; and
   attaching the one or more elastic sheets to an elastic body corresponding to each of the central holes to form the stretchable substrate, and
   wherein:
   the one or more elastic sheets include a first elastic sheet attached to a first surface of the auxetic and a second elastic sheet attached to a second surface opposite to the first surface;
   the forming of the stretchable substrate includes forming a protective frame on an inner peripheral surface of the central hole, bringing the first elastic sheet into contact with the first surface, filling each of the plurality of central holes with the elastic body in a downward direction of the second surface and curing each of the elastic bodies and the first elastic sheet, removing the protective frame, and bringing the second elastic sheet into contact with the second surface and curing the elastic body and the second elastic sheet; and
   an air gap based on the protective frame is formed between the unit structure and the elastic body.

6. The method of claim 5, wherein:
   the protective frame is made using a solute that is dissolved in a solvent; and
   the removing of the protective frame includes supplying the solvent to remove the protective frame.

7. The method of claim 5, wherein the air gap allows the elastic body and the auxetic to be deformed independently from each other in response to stretching in various axial directions.

* * * * *